(12) United States Patent
Tan et al.

(10) Patent No.: US 6,392,288 B1
(45) Date of Patent: May 21, 2002

(54) LEAD FRAME FOR ASSEMBLY FOR THIN SMALL OUTLINE PLASTIC ENCAPSULATED PACKAGES

(75) Inventors: Aik Chong Tan, Johor Bahru; Chee Hiong Chew, Negeri Sembilan; Shan Chong Tan, Selangor, all of (MY)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/728,391

(22) Filed: Dec. 4, 2000

(51) Int. Cl.[7] .............................................. H01L 23/495
(52) U.S. Cl. ........................ 257/670; 257/666; 257/676
(58) Field of Search ................................. 257/666, 676, 257/670

(56) References Cited

U.S. PATENT DOCUMENTS 6,118,173 A  *  9/2000  Emoto
6,175,150 B1 *  1/2001  Ichikawa et al.
6,208,023 B1 *  3/2001  Nakayama et al.
6,242,797 B1 *  6/2001  Ichikawa et al.
6,288,441 B1 *  9/2001  Corsis

* cited by examiner

Primary Examiner—Sheila V. Clark

(57) ABSTRACT

A lead frame for the assembly of thin small outline packages incorporating a semiconductor circuit is provided in a generally rectangular form including a plurality of conductive leads opposing one another about the longitudinal sides of the lead frame and a die mounting portion centered therebetween. In addition, a pair of leads is provided at the distal ends of the lead frame which are stamped in a general "S" shape. These stamped leads extend downwardly from the lead frame and are within the footprint of the lead frame. The footpads of these additional leads remain exposed as the lead frame is encapsulate in a plastic molded package and are level with the bottom of the molded package.

2 Claims, 2 Drawing Sheets

LEAD FRAME FOR ASSEMBLY FOR THIN SMALL OUTLINE PLASTIC ENCAPSULATED PACKAGES

FIELD OF THE INVENTION

The present invention relates to semiconductor packaging in general and, more particularly, to a lead frame assembly for increasing metallic lead count in a thin small outline semiconductor package such as TSOP, MSOP, and other micro-series packages.

BACKGROUND OF THE INVENTION

Small outline packaging is well known in the art of micro series packages. Typical of the art are the TSOP 5 and TSOP 8 packages. The TSOP 5 package has a greater die-mounting pad than the TSOP 8 package but is only available with five external conductive leads. This limits the complexity and functionality of the semiconductor device that can be encapsulated within the package.

The TSOP 8 package can have eight isolated conductive leads for an 8 pin I/O count but has a restrictive die-mounting portion. This smaller die-mounting portion is typically too small to accommodate an eight pin semiconductor device. This packaging may result in higher/bigger packaging and required packaging space.

Accordingly, a need exists for a small outline package, which maintains the larger die-mounting area such as the TSOP 5 micro-series package while having superior lead count as available in the small outline micro-series package. In addition, the additional lead count should not cause an increase in the minimal packaging outline.

DETAILED DESCRIPTION OF THE DRAWINGS

Figure 1:
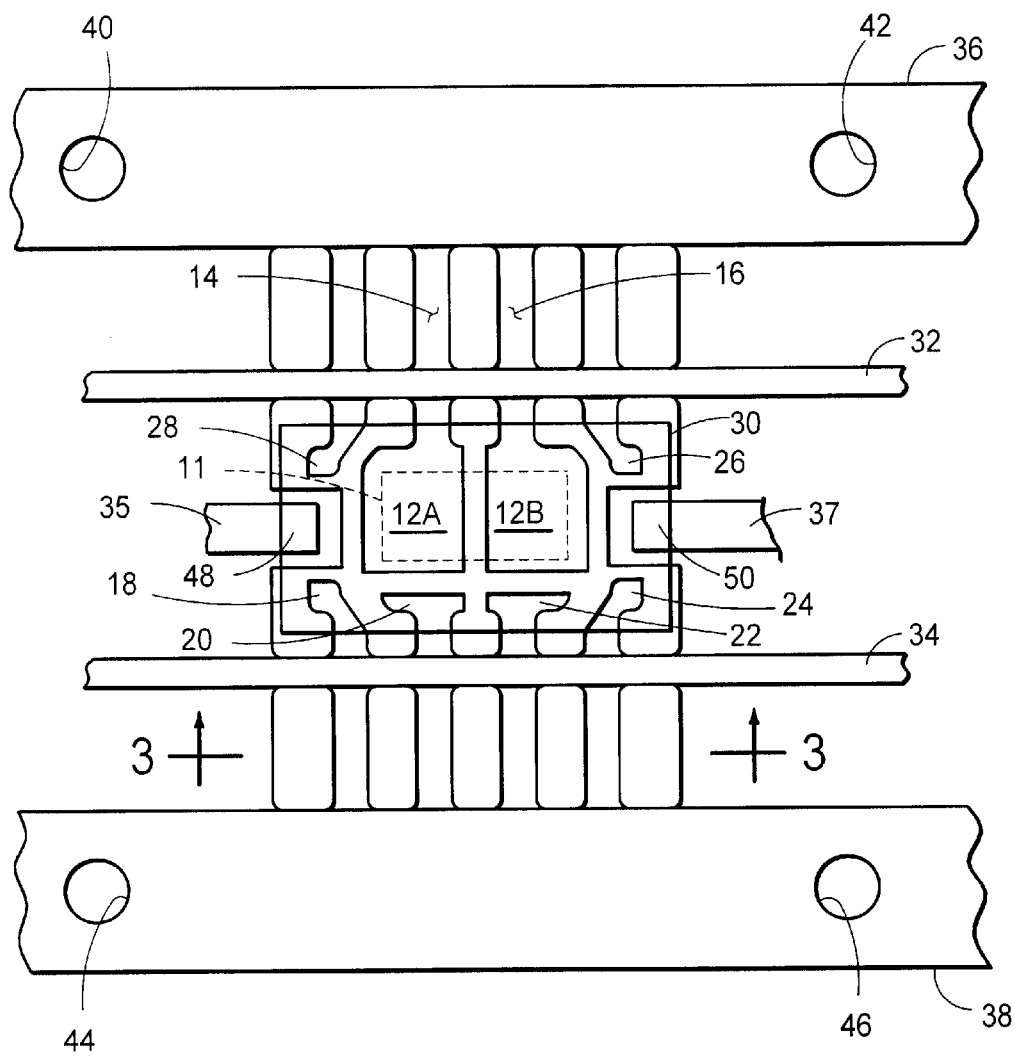
FIG. 1 is an enlarged plan view of the lead frame of the present invention.

Turning now to FIG. 1 there is shown an expanded plan view of a generally rectangular lead frame 10 in accordance with the present invention that, when incorporated into a semiconductor package arrangement, provides additional leads for more complex circuitry in a microseries package as will be more completely described. Lead frame 10 includes a pair of die mounting portions or flags 12A and 12B connected respectively to metallic or conductive leads 14 and 16 that extend externally to the molded plastic semiconductor package. In some cases an integrated circuit die 11 (shown in dashed outline form) may be mounted to both flags 12A and 12B in which case only one of the leads 14 or 16 is used. Additionally, lead frame 10 includes conductive metallic leads 18, 20, 22, and 24 also extending externally from one side of the plastic encapsulation package as will be shown. The outline of the plastic semiconductor package, which encapsulates lead frame 10 and within which the semiconductor circuit die 11 resides, is shown at 30. Stamped lead frame 10 uses metallic tie bars 32, 34, 35, and 37 to add stability to the thin lead frame during assembly process. Additional strips 36 and 38 provide stability, as well as, manufacturability in a typical manner. Openings 40, 42, 44, and 46 formed in the strips 36 and 38 are utilized in a known manner to position lead frames 10 in process equipment such that the strip is moved through an assembly machine.

Figure 2:
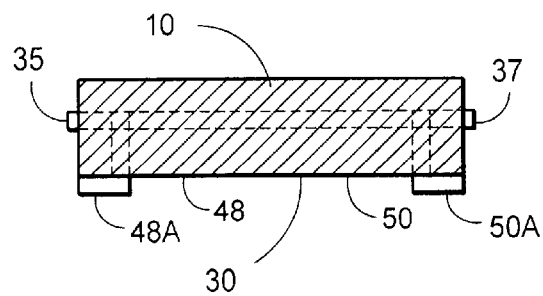
FIG. 2 is a side view of the lead frame illustrating downward extending leads of the present invention.

Lead frame 10 as so far described above is fairly conventional in structure. In addition, the assembly process for bonding and connecting the semiconductor circuit to the leads within the plastic encapsulation package referred to above is also known. The uniqueness of lead frame 10 and the semiconductor package made up thereof is the inclusion of additional conductive leads 48 and 50 formed at both ends of the elongated direction of lead frame 10. As shown in FIG. 2 molded package 30 encapsulates lead frame 10 and opposing leads 48 and 50. Leads 48 and 50 are stamped during the manufacturing process in a general "S" shape so that they are effectively locked to the package such that the bottom foot pads 48A and 50A are essentially at the bottom level of package 30 but are exposed to provide connection to internal semiconductor circuitry.

Figure 3:
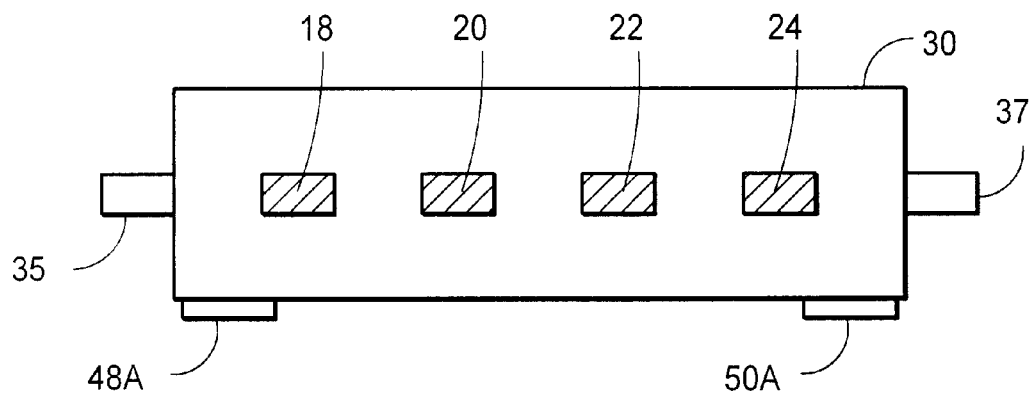
FIG. 3 is a side view of the encapsulated lead frame assembly and semiconductor package.

Turning to FIG. 3 there is shown the final assembled semiconductor package 30 in side view. The thickness of leads 48 and 50 as well as the other leads and tie bars are exaggerated in this view for clarity. In reality, footpad's 48A and 50A are at the same level as the bottom of molded package 30 and lie within the external boundaries at opposing parallel and perpendicular ends thereof.

Figure 4:
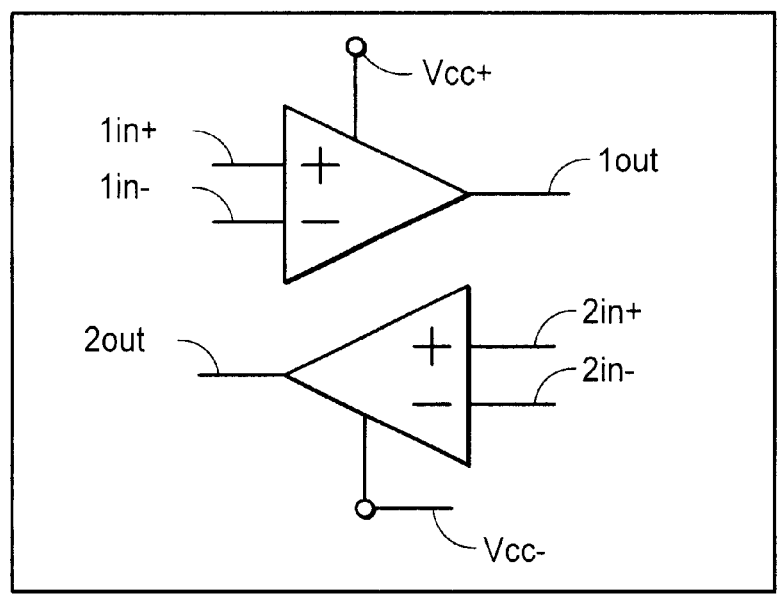
FIG. 4 illustrates a type of semiconductor circuit that may be manufactured utilizing the additional leads of the lead frame of FIG. 1.

The aforedescribed novel lead frame enables a more complex integrated circuit to be placed within the package than prior art thin small outline packages (TSOP). This is possible since a larger die mounting portion is made possible by the additional leads 48 and 50 being placed at opposing longitudinal ends of lead frame 50. The "s" shape of these two leads allow the lead frame to fit within the footprint of a TSOP while providing two additional leads. For example, referring to FIG. 4, a more complex circuit can be incorporated into the inventive lead frame package than previous TSOPs. Thus, in one illustrative application, a dual operational amplifier circuit is provided requiring eight leads.

In summary, what has been described is a novel lead frame for use in micro-series packages. The lead frame provides a die pad large enough to accommodate larger and more complex semiconductor circuitry by incorporating a pair of additional leads. These leads are placed at opposite ends along the longitudinal sides of the generally rectangular lead frame. They are then stamped in a "S" shaped configuration to provide effective locking in the package and to be exposed within the foot print of the package and at the bottom level thereof. Thus, the lead frame, semiconductor package, provides the advantage of keeping within conventional TSOP dimensional guidelines while providing up to two additional leads thereby allowing more complex circuitry to be used.

What is claimed is:

1. A lead frame for the assembly of thin small outline packages incorporating a semiconductor circuit comprising:

a first group of metallic members including a die mounting portion and a first plurality of leads;

a first metallic interconnecting tie bar in proximity of said die mounting portion for holding said first plurality of leads in alignment;

a second group of metallic members including a second plurality of leads aligned opposite to said first plurality of leads;

a second metallic interconnecting tie bar for holding said second plurality of leads in alignment; and at least one additional metallic lead grouped at one end of said lead frame and formed in an "S" shape extending downward from said lead frame within the interior thereof.

2. The lead frame of claim 1 including an additional metallic lead grouped at the other end of said lead framed and formed in a "S" shape extending downward from said lead frame within the interior thereof.

* * * * *